(12) United States Patent
Kim

(10) Patent No.: US 11,637,549 B2
(45) Date of Patent: Apr. 25, 2023

(54) REPLICA CIRCUIT AND OSCILLATOR INCLUDING THE SAME

(71) Applicant: SK hynix Inc., Gyeonggi-do (KR)

(72) Inventor: Byung Guk Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/475,607

(22) Filed: Sep. 15, 2021

(65) Prior Publication Data

US 2022/0321109 A1 Oct. 6, 2022

(30) Foreign Application Priority Data

Apr. 5, 2021 (KR) .......................... 10-2021-0044277

(51) Int. Cl.
*H03K 17/687* (2006.01)
*H03K 3/353* (2006.01)

(52) U.S. Cl.
CPC ......... *H03K 3/353* (2013.01); *H03K 17/6872* (2013.01)

(58) Field of Classification Search
CPC .. H03K 3/353; H03K 17/6872; H03K 3/0322; H03K 3/0231; H03K 3/0315; H03L 7/00; H03L 7/0995
USPC ...................................................... 331/108 R
See application file for complete search history.

(56) References Cited

U.S. PATENT DOCUMENTS

| | | | | |
|---|---|---|---|---|
| 5,767,748 A | * | 6/1998 | Nakao | H03K 3/0231 331/177 R |
| 5,963,101 A | * | 10/1999 | Iravani | H03K 3/03 327/280 |
| 11,424,751 B1 | * | 8/2022 | Tsai | H03K 3/0322 |
| 2011/0063004 A1 | * | 3/2011 | Chen | H03L 7/0995 327/157 |
| 2015/0381153 A1 | * | 12/2015 | Chaivipas | H03K 3/0322 331/57 |

FOREIGN PATENT DOCUMENTS

| KR | 101596845 B1 | 2/2016 |
|---|---|---|
| KR | 101634201 B1 | 6/2016 |

OTHER PUBLICATIONS

Alon, E., et al., Replica Compensated Linear Regulators for Supply-Regulated Phase-Locked Loops, IEEE Journal of Solid State Circuits, Feb. 2006, pp. 413-4_24, vol. 41, No. 2.

* cited by examiner

*Primary Examiner* — Richard Tan
(74) *Attorney, Agent, or Firm* — IP & T Group LLP

(57) ABSTRACT

The present technology includes a replica circuit and an oscillator including the same. The replica circuit includes a first terminal to which a replica voltage having a positive voltage is supplied, a second terminal to which a ground voltage is supplied, a replica main circuit connected between the first terminal and the second terminal and configured to form a first current path in response to the replica voltage, and a replica sub circuit connected in parallel with the replica main circuit between the first terminal and the second terminal and configured to form a second current path in response to the replica voltage. A current flowing through the second current path having a replica sub current amount is less than a current flowing through the first current path having a replica main current amount.

20 Claims, 10 Drawing Sheets

US 11,637,549 B2

REPLICA CIRCUIT AND OSCILLATOR INCLUDING THE SAME

CROSS-REFERENCE TO RELATED APPLICATION

The present application claims priority under 35 U.S.C. § 119(a) to Korean patent application number 10-2021-0044277 filed on Apr. 5, 2021, the entire disclosure of which is incorporated by reference herein.

BACKGROUND

Field of Invention

The present disclosure relates to a replica circuit and an oscillator including the same, and more particularly, to a replica circuit capable of improving reliability of the replica circuit and an oscillator including the same.

Description of Related Art

A clock generator including a phase locked loop (PLL) circuit may generate and output a clock of which a phase is fixed. For example, the clock may be used to transmit data at a transmitter or to receive or restore data at a receiver. The PLL circuit may be classified into a ring-PLL circuit, an inductor-capacitor (LC)-PLL circuit, and the like.

The PLL circuit may include an oscillator to reduce noise, and the oscillator may include a voltage controlled oscillator (VCO).

SUMMARY

An embodiment of the present disclosure provides a replica circuit capable of improving reliability and an oscillator including the same.

According to an embodiment of the present disclosure, a replica circuit includes a first terminal to which a replica voltage having a positive voltage is supplied, a second terminal to which a ground voltage is supplied, a replica main circuit connected between the first terminal and the second terminal and configured to form a first current path in response to the replica voltage, in order to replicate a current of a main circuit that generates a sub clock and an inverted sub clock in a voltage controlled oscillator, and a replica sub circuit connected in parallel with the replica main circuit between the first terminal and the second terminal and configured to form a second current path in response to the replica voltage, in order to replicate a current of a sub circuit for reducing noise of the sub clock and the inverted sub clock in the voltage controlled oscillator. The replica main circuit is configured so that a current flowing through the first current path has a replica main current amount, and the replica sub circuit is configured so that a current flowing through the second current path has a replica sub current amount less than the replica main current amount.

According to an embodiment of the present disclosure, an oscillator includes a voltage controlled oscillator operable according to a control voltage, including a main circuit configured to generate a clock and an inverted clock by inverting an input signal, and an inverted input signal, and a sub circuit configured to reduce noise of the clock and the inverted clock, a replica circuit operable according to a replica voltage, and including a replica main circuit configured to replicate a voltage or a current of the main circuit, and a replica sub circuit configured to replicate a voltage or a current of the sub circuit, and an amplifier configured to output an amplified voltage to the voltage controlled oscillator and the replica circuit by amplifying a difference between a reference voltage and the replica voltage so that the replica voltage and the control voltage are equal to each other. The voltage controlled oscillator is configured to adjust the control voltage in response to the amplified voltage, and the replica circuit is configured to maintain a level of the replica voltage in response to the amplified voltage, and the level of the replica voltage is adjusted according to a size of switches configuring the replica main circuit and the replica sub circuit.

According to an embodiment of the present disclosure, an oscillating circuit includes a first transistor and a voltage controlled oscillator (VCO) serially coupled between power and ground nodes, a second transistor and a replica circuit serially coupled between the power and ground nodes and an amplifier configured to compare a reference voltage and a replica voltage to generate a control voltage for controlling turn-on levels of the respective first and second transistors. The VCO includes first to fourth inverters coupled in parallel, the first and second inverters are configured to invert respective inputs, and the third and fourth inverters are cross-coupled to each other and configured to reduce noises of outputs of the respective first and second inverters. The replica voltage is a voltage on a node between the second transistor and the replica circuit. The replica circuit replicates, based on the replica voltage, a main current running within the first and second inverters and a sub current running within the third and fourth inverters. The main current has a greater amount than the sub current.

The present technology may improve reliability of the replica circuit, and thus may improve reliability of the oscillator including the replica circuit.

DETAILED DESCRIPTION

Specific structural or functional descriptions of embodiments according to the concept which are disclosed in the present specification are illustrated only to describe the embodiments according to the concept of the present disclosure. The embodiments according to the concept of the present disclosure may be carried out in various forms and should not be construed as being limited to the embodiments described in the present specification.

Figure 1:
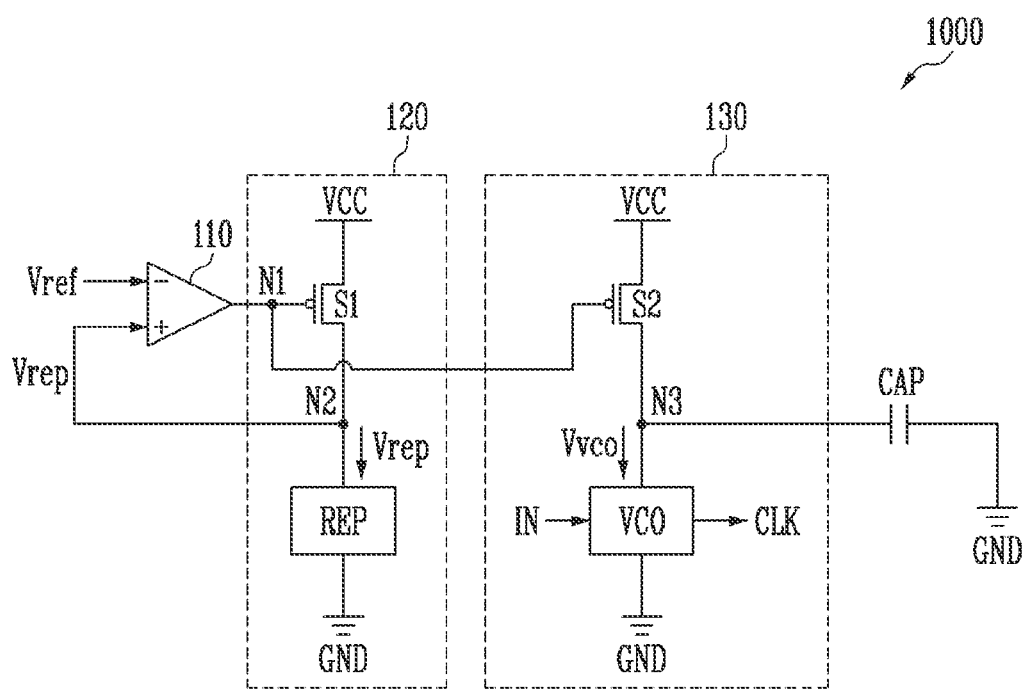
FIG. 1 is a diagram illustrating an oscillator according to an embodiment of the present disclosure.

FIG. 1 is a diagram illustrating an oscillator 1000 according to an embodiment of the present disclosure.

Referring to FIG. 1, the oscillator 1000 may include an amplifier 110, a replica group 120, and a voltage control group 130.

The amplifier 110 may be configured to amplify a difference between voltages input to two input terminals. A reference voltage Vref may be applied to a negative input terminal of the amplifier 110, and a replica voltage Vrep having a positive voltage may be applied to a positive input terminal of the amplifier 110. For example, when the replica voltage Vrep is higher than the reference voltage Vref having a positive voltage, the amplifier 110 may output, to a first node N1, a first amplified voltage obtained by amplifying a difference between the replica voltage Vrep and the reference voltage Vref. The first amplified voltage may be a positive voltage. Conversely, when the replica voltage Vrep is lower than the reference voltage Vref, the amplifier 110 may output, to the first node N1, a second amplified voltage obtained by amplifying the difference between the replica voltage Vrep and the reference voltage Vref. The second amplified voltage may be a negative voltage.

The replica group 120 may be configured to have a connection configuration electrically similar to that of the voltage control group 130. The replica group 120 may be configured to receive a power voltage VCC and generate the replica voltage Vrep in response to the first or second amplified voltage on the first node N1. For example, the replica group 120 may include a first switch S1 and a replica circuit REP. The first switch S1 may be connected between a terminal to which the power voltage VCC is supplied and a second node N2 and may include a PMOS transistor of which a turn-on level is adjusted according to the amplified voltage of the first node N1. For example, as the amplified voltage of the first node N1 is decreased, the turn-on level of the first switch S1 may be increased, and as the amplified voltage of the first node N1 is increased, the turn-on level of the first switch S1 may be decreased or the first switch S1 may be turned off. The replica circuit REP may be connected between the second node N2 and a terminal to which a ground voltage GND is applied and may be configured to maintain an internal current amount constant according to the replica voltage Vrep supplied through the second node N2.

The voltage control group 130 may be configured to receive the power voltage VCC and generate a control voltage Vvco having a positive voltage in response to the amplified voltage of the first node N1. For example, the voltage control group 130 may include a second switch S2 and a voltage controlled oscillator (VCO). The second switch S2 may be connected between a terminal to which the power voltage VCC is supplied and a third node N3 and may include a PMOS transistor of which a turn-on level is adjusted according to the amplified voltage of the first node N1. For example, as the amplified voltage of the first node N1 is decreased, the turn-on level of the second switch S2 may be increased, and as the amplified voltage of the first node N1 is increased, the turn-on level of the second switch S2 may be decreased or the second switch S2 may be turned off. The voltage controlled oscillator VCO may be connected between the third node N3 and the terminal to which the ground voltage GND is applied, and may be configured to output a clock CLK in response to an input signal IN. For example, the voltage controlled oscillator VCO may be configured to receive a control voltage Vvco as a voltage source and output the clock CLK in which noise is reduced in response to the input signal IN.

The oscillator 1000 may further include a capacitor CAP connected between the third node N3 and the terminal to which the ground voltage GND is applied to reduce noise of the control voltage Vvco.

As shown in FIG. 1, the replica group 120 and the voltage control group 130 may be connected in parallel between the terminal to which the power voltage VCC is supplied and the terminal to which the ground voltage GND is applied and may be configured to output the replica voltage Vrep or the control voltage Vvco in response to the amplified voltage of the first node N1 commonly. The replica group 120 according to the present embodiment may include the replica circuit REP configured of transistors having a size different from that of transistors configuring the voltage controlled oscillator VCO, in order to internally maintain a constant current amount.

Figure 2:
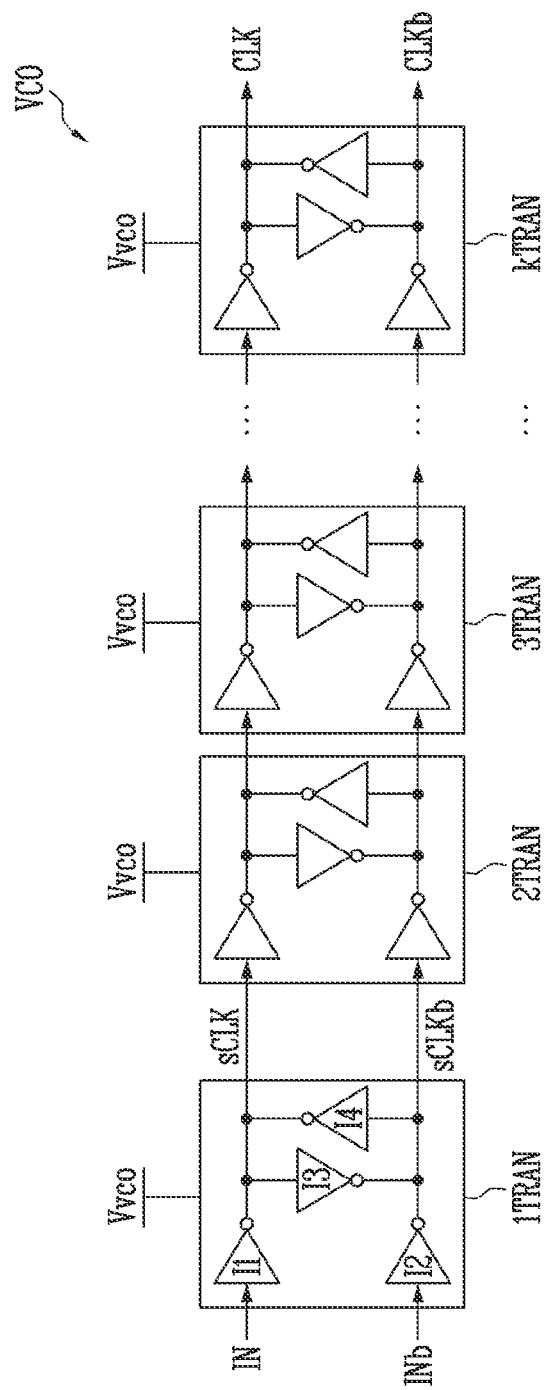
FIG. 2 is a diagram illustrating a voltage controlled oscillator according to an embodiment of the present disclosure.

FIG. 2 is a diagram illustrating a voltage controlled oscillator VCO according to an embodiment of the present disclosure.

Referring to FIG. 2, the voltage controlled oscillator VCO may include first to k-th transmission circuits 1TRAN to kTRAN configured to output a clock CLK and an inverted clock CLKb in response to an input signal IN and an inverted input signal INb. The inverted input signal INb may be a signal of which a phase or a level is opposite to that of the input signal IN. For example, when the input signal IN is a signal having a high level, the inverted input signal INb may be a signal having a low level.

The first to k-th transmission circuits 1TRAN to kTRAN may operate by receiving the control voltage Vvco as a voltage source and may be configured to reduce noise of the input signal IN and the inverted input signal INb and output the clock CLK and the inverted clock CLKb. The inverted clock CLKb may be a clock of which a phase is opposite to that of the clock CLK.

The first to k-th transmission circuits 1TRAN to kTRAN may be connected in series with each other. Therefore, the input signal IN and the inverted input signal INb may be input to the first transmission circuit 1TRAN, and the k-th transmission circuit kTRAN, which is the last circuit, may output the clock CLK and the inverted clock CLKb. As an example, the clocks and inverted clocks output from each of the first to (k−1)-th transmission circuits 1TRAN to (k−1) TRAN are sub clocks sCLK and inverted sub clocks sCLKb, the sub clock sCLK and the inverted sub clock sCLKb output from a previous transmission circuit may be input as an input signal and an inverted input signal of a next transmission circuit. For example, the sub clock sCLK output from the first transmission circuit 1TRAN may be input to the second transmission circuit 2TRAN as an input signal, and the inverted sub clock sCLKb output from the first transmission circuit 1TRAN may be input to the second transmission circuit 2TRAN as an inverted input signal.

The first to k-th transmission circuits 1TRAN to kTRAN may be configured in the same structure. When the first transmission circuit 1TRAN is described as an example, the first transmission circuit 1TRAN may include two main inverters I1 and I2 and two sub inverters I3 and I4. The main inverters I1 and I2 may determine phases of the sub clock sCLK and the inverted sub clock sCLKb in response to the input signal IN and the inverted input signal INb, and the sub inverters I3 and I4 may reduce noise of the sub clock sCLK and the inverted sub clock sCLKb output from the main inverters I1 and I2. For example, the first inverter I1 may be configured to output the sub clock sCLK by inverting the input signal IN, and the second inverter I2 may be configured to output the inverted sub clock sCLKb by inverting the inverted input signal INb. An output node of the first inverter I1 and an output node of the second inverter I2 may be configured to be separated from each other, and the third and fourth inverters I3 and I4 may be connected in parallel between the terminal to which the control voltage Vvco is applied and the terminal to which the ground voltage GND is applied. The third and fourth inverters I3 and I4 may receive signals of output nodes of the first and second inverters I1 and I2, respectively, and output signals to the output nodes of the second and first inverters I2 and I1, respectively. For example, the third inverter I3 may be configured to invert the sub clock sCLK output from the first inverter I1 and transmit the inverted sub clock sCLKb to the output node of the second inverter I2, and the fourth inverter I4 may be configured to invert the inverted sub clock sCLKb output from the second inverter I2 and transmit the sub clock sCLK to the output node of the first inverter I1. A configuration of the first transmission circuit 1TRAN is more specifically described as follows.

Figure 3:
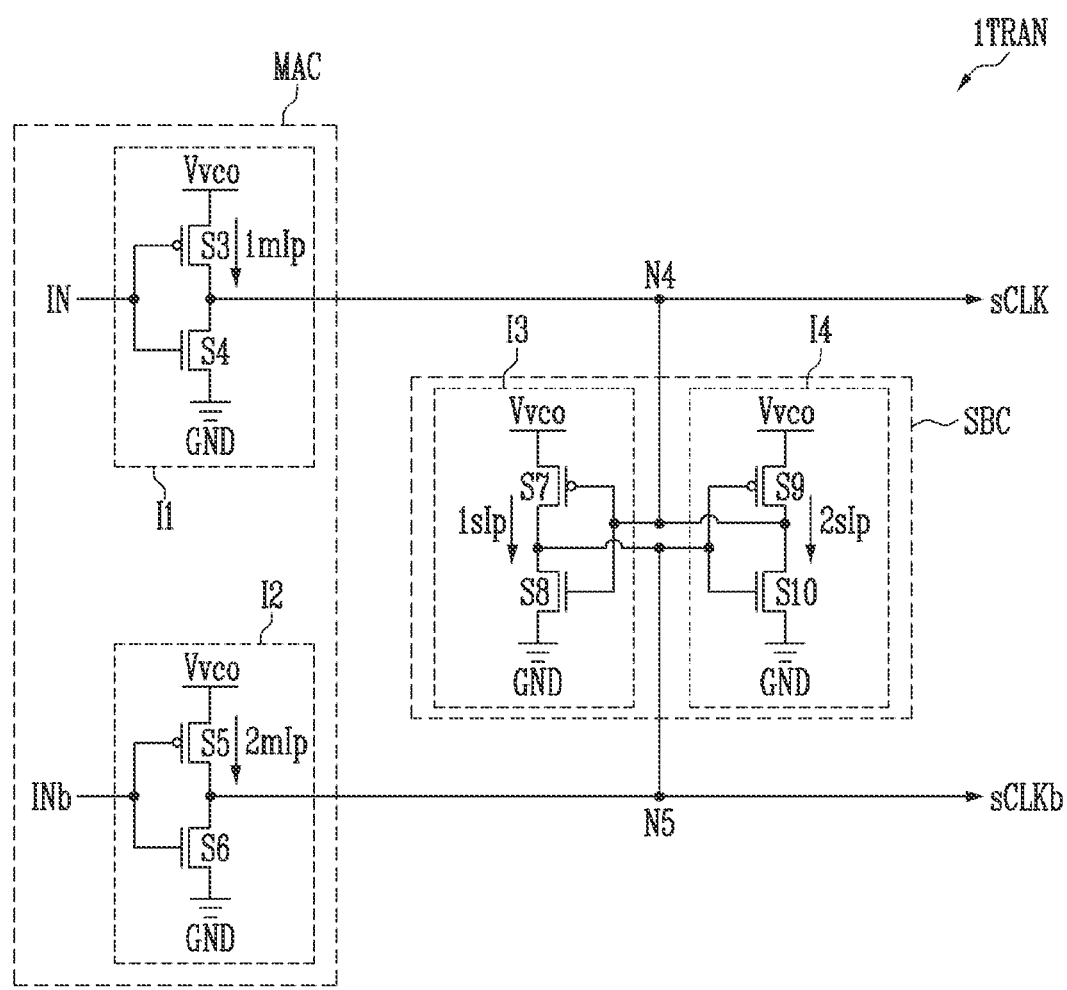
FIG. 3 is a diagram illustrating a first transmission circuit according to an embodiment of the present disclosure.

FIG. 3 is a diagram illustrating a first transmission circuit 1TRAN according to an embodiment of the present disclosure.

Referring to FIG. 3, the first transmission circuit 1TRAN may include a main circuit MAC configured to determine the phases of the sub clock sCLK and the inverted sub clock sCLKb, and a sub circuit SBC configured to reduce the noise of the sub clock sCLK and the inverted sub clock sCLKb.

The main circuit MAC may include the first inverter I1 configured to output the sub clock sCLK by inverting the input signal IN, and the second inverter I2 configured to output the inverted sub clock sCLKb by inverting the inverted input signal INb. The first and second inverters I1 and I2 may be implemented in the same structure. For example, the first and second inverters I1 and I2 may include third to sixth switches S3 to S6. Sizes of the third to sixth switches S3 to S6 may be determined by a width and a length of transistors configuring each of the switches. For example, the sizes of the third and fifth switches S3 and S5 may be implemented identically to each other, and the sizes of the fourth and sixth switches S4 and S6 may be implemented identically to each other. The sizes of the third and fifth switches S3 and S5 may be implemented to be larger than the sizes of the fourth and sixth switches S4 and S6, and the sizes of the third to sixth switches S3 to S6 may be implemented identically to each other.

The first inverter I1 may include third and fourth switches S3 and S4 connected in series between a terminal to which the control voltage Vvco is applied and the terminal to which the ground voltage GND is applied. The third switch S3 may include a PMOS transistor configured to apply a positive voltage to a fourth node N4 in response to the input signal IN. The fourth switch S4 may include an NMOS transistor configured to discharge the fourth node N4 in response to the input signal IN. Since the third and fourth switches S3 and S4 are implemented with different types of transistors, the third and fourth switches S3 and S4 may be turned on by different levels or may be turned off at different times in response to the input signal IN. Hereinafter, a current amount flowing through the fourth node N4 according to the input signal IN is a first main current amount 1 mIp.

The second inverter I2 may include fifth and sixth switches S5 and S6 connected in series between the terminal to which the control voltage Vvco is applied and the terminal to which the ground voltage GND is applied. The fifth switch S5 may include a PMOS transistor configured to apply a positive voltage to a fifth node N5 in response to the inverted input signal INb. The sixth switch S6 may include an NMOS transistor configured to discharge the fifth node N5 in response to the inverted input signal INb. Since the fifth and sixth switches S5 and S6 are implemented with different types of transistors, the fifth and sixth switches S5 and S6 may be turned on by different levels or turned off at different times in response to the inverted input signal INb. Hereinafter, a current amount flowing through the fifth node N5 according to the inverted input signal INb is a second main current amount 2mIp.

The third and fourth inverters I3 and I4 may be configured with seventh to tenth switches S7 to S10 having a size smaller than that of the switches S3 to S6 included in the first and second inverters I1 and I2, in order to reduce the noise of the sub clock sCLK and the inverted sub clock sCLKb. As the size of the transistors configuring the switches is decreased, turn-on levels of the switches is decreased, and thus a current amount may be finely adjusted.

Among the seventh to tenth switches S7 to S10, sizes of the seventh and ninth switches S7 and S9 may be implemented identically to each other, and sizes of the eighth and tenth switches S8 and S10 also may be implemented identically to each other. The sizes of the seventh and ninth switches S7 and S9 may be implemented to be larger than the sizes of the eighth and tenth switches S8 and S10, or may be implemented identically to each other. Since the sizes of the seventh to tenth switches S7 to S10 may be determined by a width and a length of transistors configuring each switch, a width and a length of the seventh to tenth switches S7 to S10 may be determined according to the sizes of the seventh to tenth switches S7 to S10. For example, the widths of the seventh and ninth switches S7 and S9 may be the same, and the lengths may also be the same. For example, the widths of the eighth and tenth switches S8 and S10 may be the same, and the lengths may also be the same. For example, a case where the seventh switch S7 is implemented in a size larger than that of the eighth switch S8 may mean that the width and the length of the seventh switch S7 may be greater than the width and the length of the eighth switch S8, respectively. For example, in the case where the seventh switch S7 is implemented in the size larger than that of the eighth switch S8, when the widths of the seventh and eighth switches S7 and S8 are the same, the length of the seventh switch S7 may be longer than the length of the eighth switch S8. For example, in the case where the seventh switch S7 is implemented in the size larger than that of the eighth switch S8, when the lengths of the seventh and eighth switches S7 and S8 are the same, the width of the seventh switch S7 may be wider than the width of the eighth switch S8. The sizes of the seventh and ninth switches S7 and S9 may be implemented to be smaller than the sizes of the third and fifth switches S3 and S5, and the size of the eighth and tenth switches S8 and S10 may be implemented to be smaller than the sizes of the fourth and sixth switches S4 and S6.

Comparison between the sizes of the third to sixth switches S3 to S6 included in the main circuit MAC and the sizes of the seventh to tenth switches S7 to S10 included in the sub circuit SBC is shown in 'Table 1'.

TABLE 1

| S3, S4, S5, S6 = 1SZ (MAC) | S7, S8, S9, S10 = 2SZ (SBC) |
|---|---|
| 1SZ > 2SZ | |

Referring to 'Table 1', the third to sixth switches S3 to S6 included in the main circuit MAC are implemented in a first size 1SZ, and the seventh to tenth switches S7 to S10 included in the sub circuit SBC are implemented in a second size 2SZ. Since the second size 2SZ is smaller than the first size 1SZ, the seventh to tenth switches S7 to S10 included in the sub circuit SBC may be implemented in a size smaller than that of the third to sixth switches S3 to S6.

TABLE 2

| S3, S5 = 1SZ (MAC) | S7, S9 = 3SZ (SBC) |
|---|---|
| S4, S6 = 2SZ (MAC) | S8, S10 = 4SZ (SBC) |
| 1SZ > 2SZ | 3SZ > 4SZ |
| 1SZ > 3SZ | |
| 2SZ > 4SZ | |
| 2SZ ≥ 3 SZ | |

Referring to 'Table 2', the third and fifth switches S3 and S5 included in the main circuit MAC are implemented in a first size 1SZ, the fourth and sixth switches S4 and S6 are implemented in a second size 2SZ, the seventh and ninth switches S7 and S9 included in the sub circuit SBC are implemented in a third size 3SZ, and the eighth and tenth switches S8 and S10 are implemented in a fourth size 4ZS. The size of 'Table 2' is not related to the size of 'Table 1'. The second size 2SZ may be smaller than the first size 1SZ, and the fourth size 4SZ may be smaller than the third size 3SZ. The third size 3SZ may be smaller than the first size 1SZ, and the fourth size 4SZ may be smaller than the second size 2SZ. That is, the switches included in the sub circuit SBC may be implemented to be smaller than the switches included in the main circuit MAC. In addition, the sizes of the seventh and ninth switches S7 and S9 included in the sub circuit SBC may be implemented to be equal to or smaller than the sizes of the fourth and sixth switches S4 and S6 included in the main circuit MAC.

The third inverter I3 may include the seventh and eighth switches S7 and S8 connected in series between the terminal to which the control voltage Vvco is applied and the terminal to which the ground voltage GND is applied. The seventh switch S7 may include a PMOS transistor configured to apply a positive voltage to the fifth node N5 in response to the sub clock sCLK applied to the fourth node N4. The eighth switch S8 may include an NMOS transistor configured to discharge the fifth node N5 in response to the sub clock sCLK applied to the fourth node N4. Since the seventh and eighth switches S7 and S8 are implemented with different types of transistors, the seventh and eighth switches S7 and S8 may be turned on by different levels or may be turned off at different times in response to the sub clock sCLK. Hereinafter, a current amount flowing through the fifth node N5 according to the sub clock sCLK is a first sub current amount 1sIp.

The fourth inverter I4 may include the ninth and tenth switches S9 and S10 connected in series between the terminal to which the control voltage Vvco is applied and the terminal to which the ground voltage GND is applied. The ninth switch S9 may include a PMOS transistor configured to apply a positive voltage to the fourth node N4 in response to the inverted sub clock sCLKb applied to the fifth node N5. The tenth switch S10 may include an NMOS transistor configured to discharge the fourth node N4 in response to the inverted sub clock sCLKb applied to the fifth node N5. Since the ninth and tenth switches S9 and S10 are implemented with different types of transistors, the ninth and tenth switches S9 and S10 may be turned on by different levels or turned off at different times in response to the inverted sub clock sCLKb. Hereinafter, a current amount flowing through the fourth node N4 according to the inverted sub clock sCLKb is a second sub current amount 2sIp.

Each of current amounts of the main circuit MAC and the sub circuit SBC is described as follows.

Figure 4:
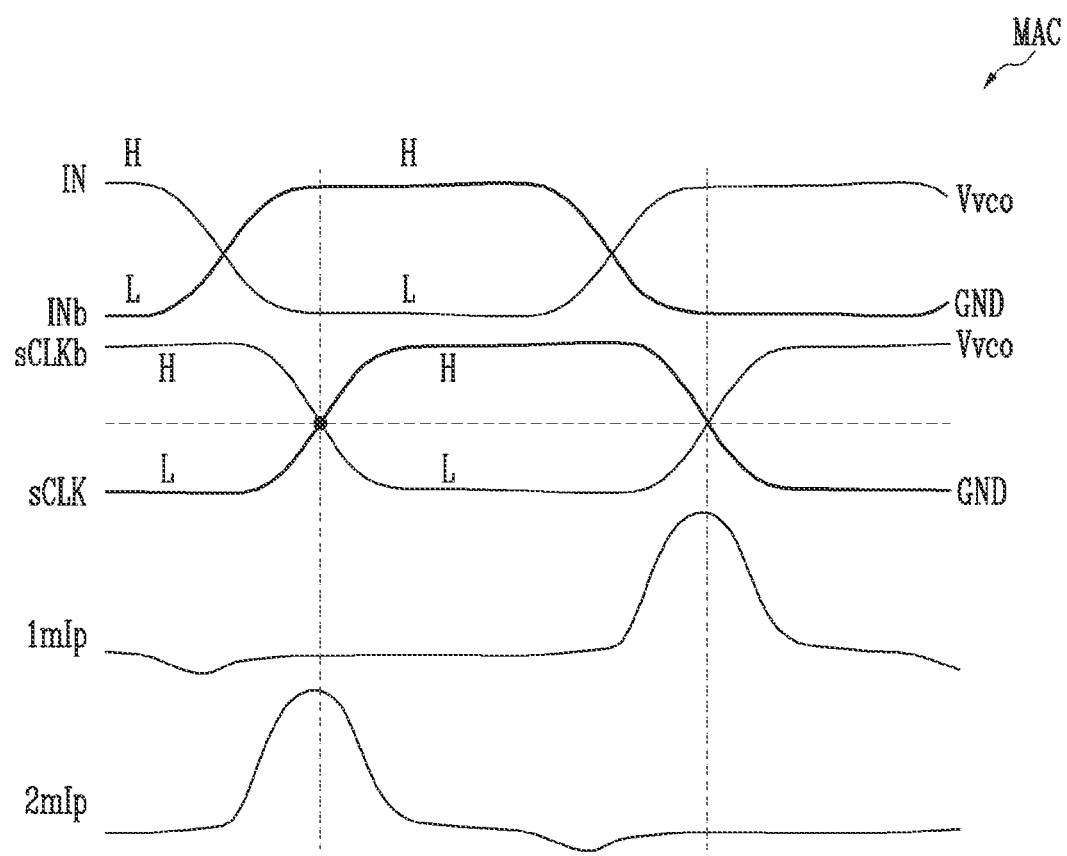
FIG. 4 is a diagram illustrating a current amount of current flowing in a main circuit of the voltage controlled oscillator according to an embodiment of the present disclosure.
Figure 5:
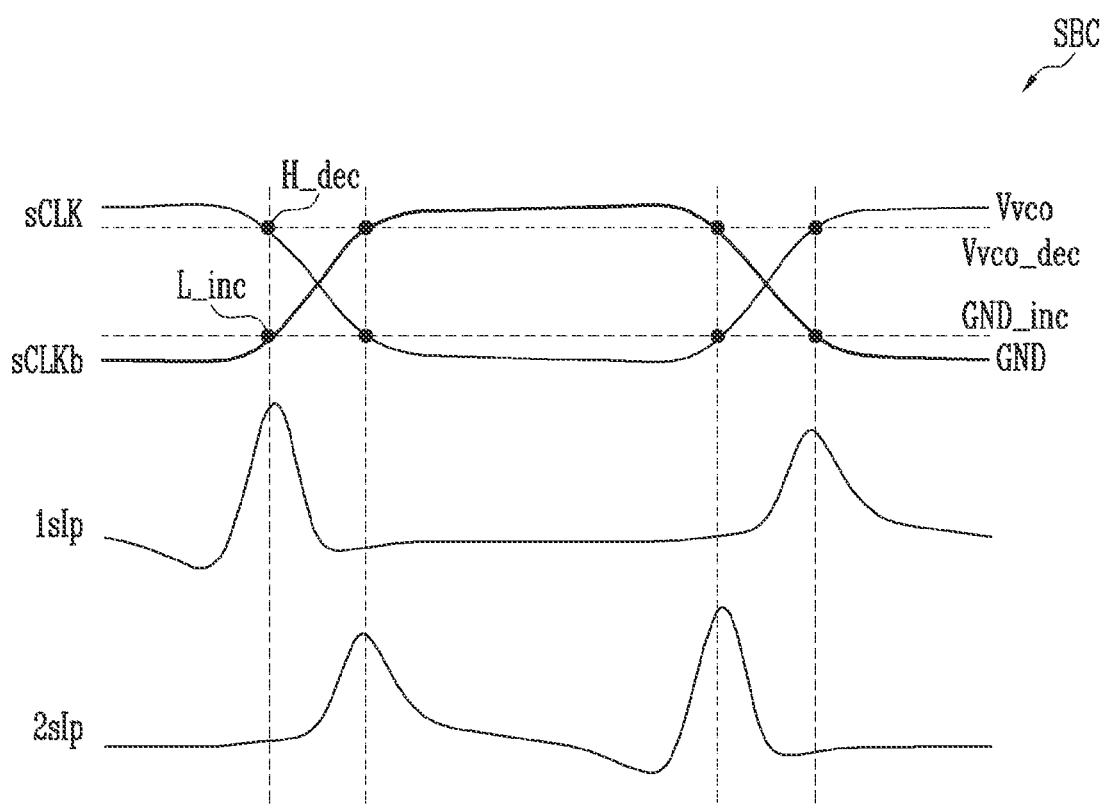
FIG. 5 is a diagram illustrating a current amount of current flowing in a sub circuit of the voltage controlled oscillator according to an embodiment of the present disclosure.

FIG. 4 is a diagram illustrating the current amount of current flowing in the main circuit of the voltage controlled oscillator according to an embodiment of the present disclosure, and FIG. 5 is a diagram illustrating the current amount flowing in the sub circuit of the voltage controlled oscillator according to an embodiment of the present disclosure.

Referring to FIGS. 3 and 4, since the main circuit MAC is configured to output the sub clock sCLK and the inverted sub clock sCLKb in response to the input signal IN and the inverted input signal INb, when the input signal IN is transited from a high level H to a low level L, the sub clock sCLK may be transited from the low level L to the high level H. Since the main circuit MAC is supplied with the control voltage Vvco and is grounded by the ground voltage GND, a voltage having the high level H may be the control voltage Vvco, and the low level L may be a level of the ground voltage GND. When the input signal IN has the high level H, since the inverted input signal INb has the low level L, when the input signal IN is transited from the high level H to the low level L, the inverted input signal INb may be transited from the low level L to the high level H. When the inverted input signal INb is transited from the low level L to the high level H, the inverted sub clock sCLKb may be transited from the high level H to the low level L.

The first main current amount 1mIp of the first inverter I1 may be increased during a predetermined period in which the fourth switch S4 is turned on and a current path is formed in the fourth node N4, and the second main current amount 2mIp of the second inverter I2 may be increased during a predetermined period in which the sixth switch S6 is turned on and a current path is formed in the fifth node N5. Therefore, the first main current amount 1mIp may be temporarily increased when the sub clock sCLK is transited from the high level H to the low level L, and the second main current amount 2mIp may be temporarily increased when the inverted sub clock sCLKb is transited from the high level H to the low level L.

Referring to FIGS. 3 and 5, since the sub circuit SBC is configured to adjust levels of the sub clock sCLK and the inverted sub clock sCLKb of different fourth and fifth nodes N4 and N5 in response to the sub clock sCLK and the inverted sub clock sCLKb, when the input signal IN is transited from the high level H to the low level L, the sub clock sCLK may be transited from the low level L to the high level H. Since the size of the sub circuit SBC is smaller than the size of the main circuit MAC, a time point when the current amount increases in the sub circuit SBC may be a time when the sub clock sCLK or the inverted sub clock sCLKb is decreased from the high level H to a decreased high level H_dec, and a time when the sub clock sCLK or the inverted sub clock sCLKb is increased from the low level L to an increased low level L_inc. For example, since threshold voltages of the seventh to tenth switches S7 to S10 are lower than threshold voltages of the third to sixth switches S3 to S6, when the seventh or ninth switch S7 or S9 is turned on, a decreased control voltage Vvco_dec having a level lower than that of the control voltage Vvco may be output through the output node. The decreased control voltage Vvco_dec may be a voltage lower than the control voltage Vvco by the threshold voltage of the seventh or ninth switch S7 or S9. When the eighth or tenth switch S8 or S10 is turned on, an increased ground voltage GND_inc having a level higher than that of the ground voltage GND may be output through the output node. Therefore, when the seventh or eighth switch S7 or S8 is turned on or the ninth or tenth switch S9 or S10 is turned on, the first or second sub current amount 1sIp or 2sIp may be temporarily increased.

Figure 6:
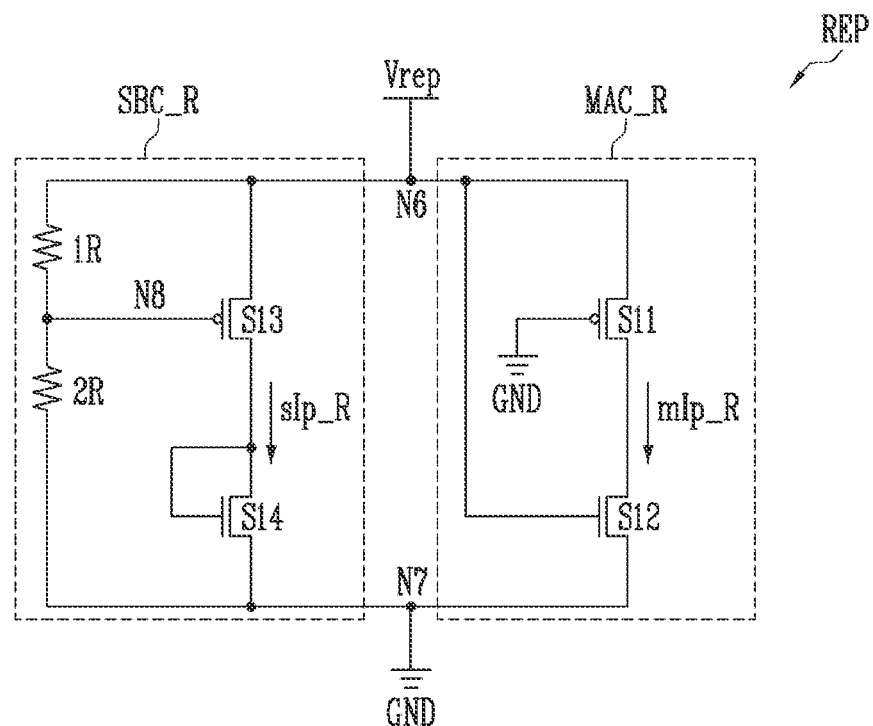
FIG. 6 is a diagram illustrating a replica circuit according to an embodiment of the present disclosure.

FIG. 6 is a diagram illustrating a replica circuit REP according to an embodiment of the present disclosure.

Referring to FIG. 6, the replica circuit REP may include a replica main circuit MAC_R and a replica sub circuit SBC_R. The replica main circuit MAC_R may be configured to replicate a voltage or a current of the main circuit MAC of FIG. 3 included in the voltage controlled oscillator, and the replica sub circuit SBC_R may be configured to replicate a voltage or a current of the sub circuit SBC of FIG. 3 included in the voltage controlled oscillator. However, since the input signal IN of FIG. 3 and the inverted input signal INb of FIG. 3 are not applied to the replica circuit REP according to the present embodiment, a constant current amount may be maintained differently from the voltage controlled oscillator VCO of FIG. 1. The replica main circuit MAC_R and the replica sub circuit SBC_R are specifically described as follows.

The replica main circuit MAC_R may be connected between a sixth node N6 to which the replica voltage Vrep is supplied and a seventh node N7 to which the ground voltage GND is supplied. Eleventh and twelfth switches S11 and S12 may be connected in series between the sixth node N6 and the seventh node N7. For example, the eleventh switch S11 may be connected between the sixth node N6 and the twelfth switch S12, and the twelfth switch S12 may be connected between the eleventh switch S11 and the seventh node N7. The eleventh switch S11 may include a PMOS transistor having a gate to which the ground voltage GND is applied. The twelfth switch S12 may include an NMOS transistor of which a gate is connected to the sixth node N6. That is, the eleventh switch S11 may be always turned on according to the ground voltage GND, and the twelfth switch S12 may be always turned on while the replica voltage Vrep is maintained at a positive voltage.

When the eleventh and twelfth switches S11 and S12 are turned on, the sixth node N6, the eleventh switch S11, the twelfth switch S12, and the seventh node N7 may be electrically connected, and thus a current path may be formed. Hereinafter, a current amount of a current flowing along the current path of the replica main circuit MAC_R is a replica main current amount mIp_R. The eleventh and twelfth switches S11 and S12 may be implemented in the same size, or the eleventh switch S11 may be implemented to be larger than the twelfth switch S12.

The replica sub circuit SBC_R may be connected between the sixth node N6 to which the replica voltage Vrep is supplied and the seventh node N7 to which the ground voltage GND is supplied. That is, the replica main circuit MAC_R and the replica sub circuit SBC_R may be connected in parallel between the sixth and seventh nodes N6 and N7. A series of thirteenth and fourteenth switches S13 and S14 and a series of first and second resistors 1R and 2R may be connected in parallel between the sixth node N6 and the seventh node N7. For example, the thirteenth and fourteenth switches S13 and S14 may be connected in series between the sixth and seventh nodes N6 and N7, and the first and second resistors 1R and 2R may also be connected in series between the sixth and seventh nodes N6 and N7. The series of the thirteenth and fourteenth switches S13 and S14 and the series of the first and second resistors 1R and 2R may be connected in parallel between the sixth and seventh nodes N6 and N7. The thirteenth switch S13 may be connected between the sixth node N6 and the fourteenth switch S14, and the fourteenth switch S14 may be connected between the thirteenth switch S13 and the seventh node N7. The first resistor 1R may be connected between the sixth node N6 and the second resistor 2R, and the second resistor 2R may be connected between the first resistor 1R and the seventh node N7. The first and second resistors 1R and 2R may be connected to each other through an eighth node N8. The first resistor 1R may be configured to have a resistance value higher than that of the second resistor 2R. For example, the first resistor 1R may be configured to have a fixed resistance value higher than the resistance value of the second resistor 2R or may be configured with a variable resistor having a resistance value higher than the resistance value of the second resistor 2R.

The thirteenth switch S13 may include a PMOS transistor of which a gate is connected to the eighth node N8. The fourteenth switch S14 may include an NMOS transistor of which a gate is connected between the thirteenth and fourteenth switches S13 and S14. When the replica voltage Vrep having the positive voltage is applied to the sixth node N6, a positive voltage lower than the replica voltage Vrep may be applied to the eighth node N8 due to the first resistor 1R. Therefore, the thirteenth switch S13 may be turned on by a level lower than that of the eleventh switch S11.

When the thirteenth switch S13 is turned on by the low level, since the positive voltage lower than the replica voltage Vrep is also applied to the node between the thirteenth and fourteenth switches S13 and S14, the fourteenth switch S14 may be turned on by a level lower than that of the switch S12. Hereinafter, a current amount of a current flowing along a current path of the replica sub circuit SBC_R is a replica sub current amount sIp_R.

Since the turn-on levels of the thirteenth and fourteenth switches S13 and S14 are lower than the turn-on levels of the eleventh and twelfth switches S11 and S12, the replica sub current amount sIp_R may have a value lower than that of the replica main current amount mIp_R. To this end, a size of the replica sub circuit SBC_R may be implemented to be smaller than a size of the replica main circuit MAC_R. For example, the thirteenth and fourteenth switches S13 and S14 may have the same size, or the thirteenth switch S13 may be implemented to be larger than the fourteenth switch S14. The thirteenth switch S13 may be implemented to be smaller than the eleventh switch S11, and the fourteenth switch S14 may be implemented to be smaller than the twelfth switch S12. In addition, the fourteenth switch S14 may be implemented to be equal to or smaller than the eleventh switch S11.

Comparison between the sizes of the eleventh and twelfth switches S11 and S12 included in the replica main circuit MAC_R and the sizes of the thirteenth and fourteenth switches S13 and S14 included in the replica sub circuit SBC_R is shown in 'Table 3'.

TABLE 3

| S11, S12 = 3SZ (MAC_R) | S13, S14 = 4SZ (SBC_R) |
|---|---|
| 3SZ > 4SZ | |

Referring to 'Table 3', the eleventh and twelfth switches S11 and S12 included in the replica main circuit MAC_R are implemented in a third size 3SZ, and the thirteenth and fourteenth switches S13 and S14 included in the replica sub circuit SBC_R are implemented in a fourth size 4SZ. The size of 'Table 3' is not related to the size of 'Table 1' and 'Table 2'. Since the fourth size 4SZ is smaller than the third size 3SZ, the thirteenth and fourteenth switches S13 and S14 included in the replica sub circuit SBC_R may be implemented in the size smaller than that of the eleventh and twelfth switches S11 and S12 included in the replica main circuit MAC_R. Therefore, the replica sub current amount sIp_R may be less than the replica main current amount mIp_R.

TABLE 4

| S11 = 1SZ (MAC_R) | S13 = 3SZ (SBC_R) |
|---|---|
| S12 = 2SZ (MAC_R) | S14 = 4SZ (SBC_R) |
| 1SZ > 2SZ | 3SZ > 4SZ |
| 1SZ > 3SZ | |
| 2SZ > 4SZ | |
| 2SZ ≥ 3SZ | |

Referring to 'Table 4', the eleventh switch S11 included in the replica main circuit MAC_R is implemented in a first size 1SZ, the twelfth switch S12 is implemented in a second size 2SZ, the thirteenth switch S13 included in the replica sub circuit SBC_R is implemented in a third size 3SZ, and the fourteenth switch S14 is implemented in a fourth size 4ZS. The size of 'Table 4' is not related to the size of 'Table 1' to 'Table 3'. The second size 2SZ may be smaller than the first size 1SZ, and the fourth size 4SZ may be smaller than the third size 3SZ. The third size 3SZ may be smaller than the first size 1SZ, and the fourth size 4SZ may be smaller than the second size 2SZ. That is, the switches included in the replica sub circuit SBC_R may be implemented to be smaller than the switches included in the replica main circuit MAC_R. In addition, the size of the thirteenth switch S13 included in the replica sub circuit SBC_R may be implemented to be equal to or smaller than the size of the twelfth switch S12 included in the replica main circuit MAC_R.

Comparison between the size of the switches included in the first transmission circuit 1TRAN of FIG. 3 and the size of the switch included in the replica circuit REP is shown in 'Table 5'.

TABLE 5

| VCO | |
|---|---|
| S3, S4, S5, S6 = 1SZ (MAC) | S7, S8, S9, S10 = 2SZ (SBC) |
| REP | |
| S11, S12 = 3SZ (MAC_R) | S13, S14 = 4SZ (SBC_R) |
| 1SZ > 2SZ | |
| 3SZ > 4SZ | |
| 1SZ > 3SZ > 4SZ > 2SZ | |

Referring to 'Table 5', the switches included in the main circuit MAC may have the largest first size 1SZ, the switches included in the replica main circuit MAC_R may be implemented in a third size 3SZ smaller than the first size 1SZ, the switches included in the replica sub circuit SBC_R may be implemented in a fourth size 4SZ smaller than the third size 3SZ, and the switches included in the sub circuit SBC may have the smallest second size 2SZ.

TABLE 6

| VCO | |
|---|---|
| S3, S5 = 1SZ (MAC) | S7, S9 = 3SZ (SBC) |
| S4, S6 = 2SZ (MAC) | S8, S10 = 4SZ (SBC) |
| REP | |
| S11 = 5SZ (MAC_R) | S13 = 7SZ (SBC_R) |
| S12 = 6SZ (MAC_R) | S14 = 8SZ (SBC_R) |
| 1SZ > 2SZ | |
| 3SZ > 4SZ | |
| 1SZ > 3SZ | |
| 2SZ > 4SZ | |
| 2SZ ≥ 3 SZ | |
| 5SZ > 6SZ | |
| 7SZ > 8SZ | |
| 5SZ > 7SZ | |
| 6SZ > 8SZ | |
| 6SZ ≥ 7SZ | |
| 1SZ > 5SZ | |
| 2SZ > 6SZ | |
| 3SZ > 7SZ | |
| 4SZ > 8SZ | |

Referring to 'Table 6', the third and fifth switches S3 and S5 included in the main circuit MAC may have the largest first size 1SZ, and the fourteenth switch S14 included in the replica sub circuit SBC_R may have the smallest eighth size 8SZ. For example, the eleventh switch S11 included in the replica main circuit MAC_R may be implemented to be smaller than the third and fifth switches S3 and S5 included in the main circuit MAC, and the twelfth switch S12 included in the replica main circuit MAC_R may be implemented to be smaller than the fourth and sixth switches S4 and S6 included in the main circuit MAC. The thirteenth switch S13 included in the replica main circuit MAC_R may be implemented to be smaller than the seventh and ninth switches S7 and S9 included in the main circuit MAC, and the fourteenth switch S14 included in the replica main circuit MAC_R may be implemented to be smaller than the eighth and tenth switches S8 and S10 included in the main circuit MAC.

Figure 7:
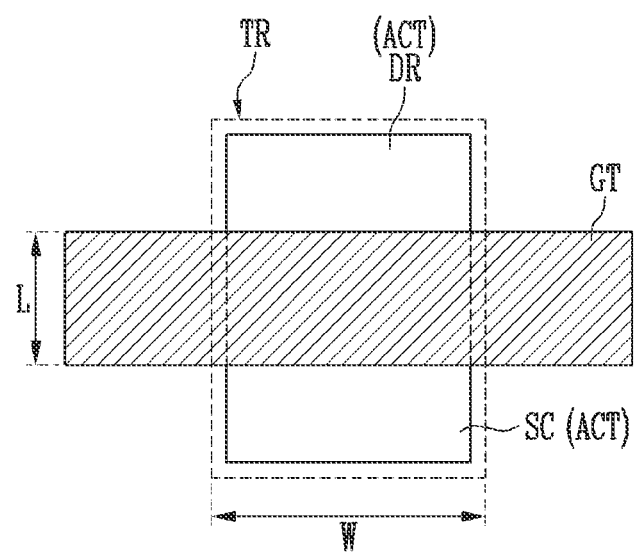
FIG. 7 is a diagram illustrating sizes of transistors included in the replica circuit according to an embodiment of the present disclosure.

FIG. 7 is a diagram illustrating sizes of transistors included in the replica circuit according to an embodiment of the present disclosure.

Referring to FIGS. 6 and 7, a transistor TR may include a drain DR and a source SC formed in an active region ACT of a wafer, and a gate GT formed on the active region ACT. When the eleventh switch S11 is described as an example, the drain DR may be connected to the sixth node N6, the source SC may be connected to the drain of the twelfth switch S12, and the gate GT may be connected to the terminal to which the ground voltage GND is applied. The size of the eleventh switch S11 may be determined according to a width W and a length L of the transistor TR. When the twelfth switch S12 is described as an example, the drain DR may be connected to the eleventh switch S11, the source SC may be connected to the seventh node N7, and the gate GT may be connected to the sixth node N6. The size of the twelfth switch S12 may be determined according to the width W and the length L of the transistor TR. As the width W and length L of the transistors TR configuring the eleventh and twelfth switches S11 and S12 decrease, the replica main current amount mIp_R of the replica main circuit MAC_R may decrease.

Figure 8:
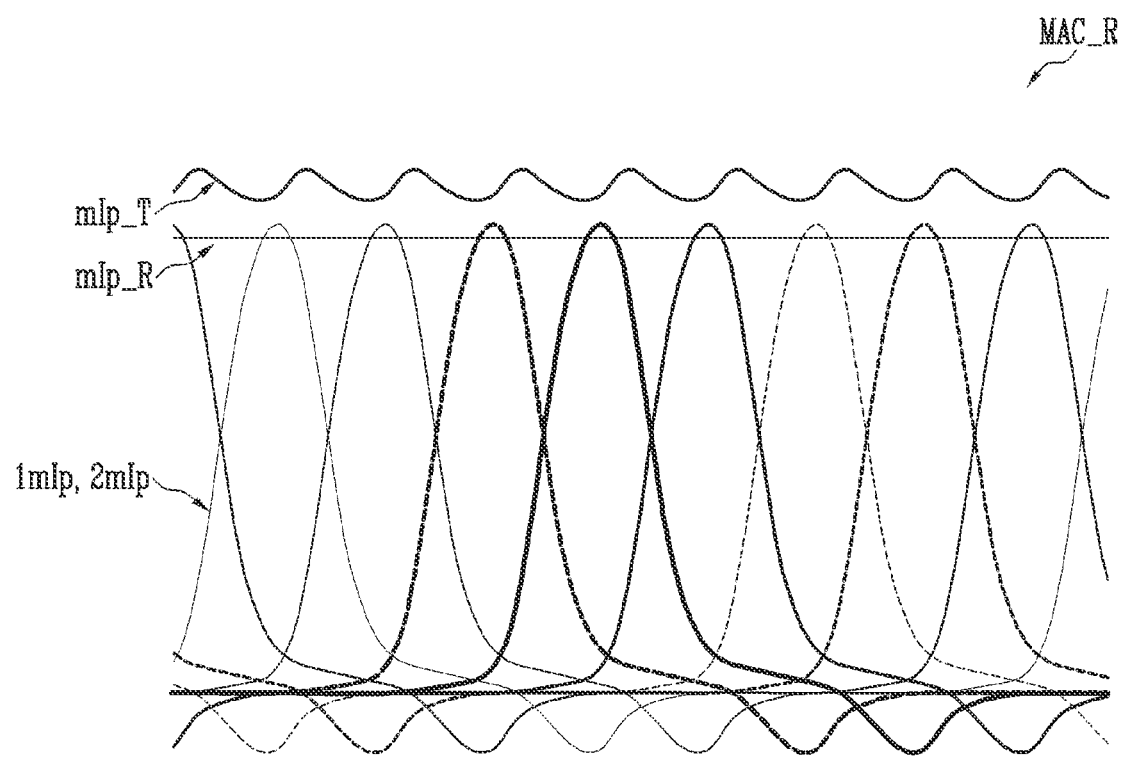
FIG. 8 is a diagram illustrating a current amount of current flowing in a replica main circuit of the replica circuit according to an embodiment of the present disclosure.
Figure 9:
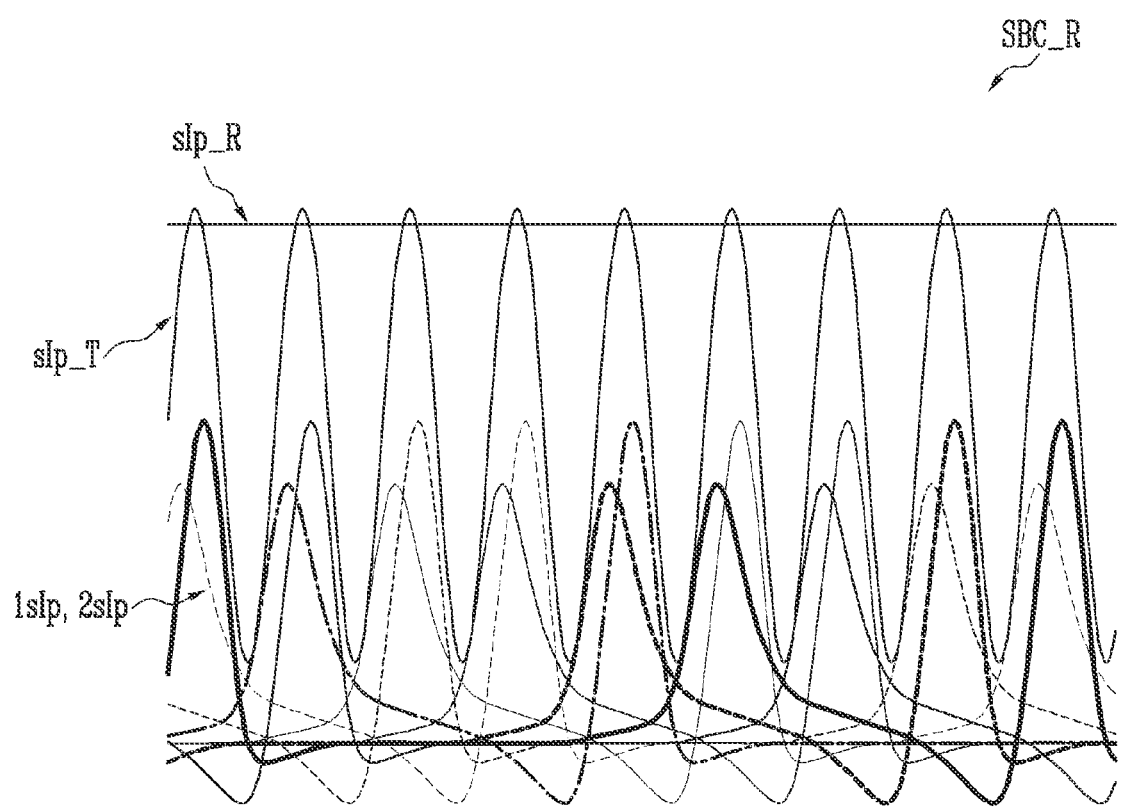
FIG. 9 is a diagram illustrating a current amount of current flowing in a replica sub circuit of the replica circuit according to an embodiment of the present disclosure.

FIG. 8 is a diagram illustrating a current amount of current flowing in the replica main circuit of the replica circuit according to an embodiment of the present disclosure, and FIG. 9 is a diagram illustrating a current amount flowing in the replica sub circuit of the replica circuit according to an embodiment of the present disclosure.

Referring to FIGS. 3, 6 and 8, the first and second main current amounts 1mIp and 2mIp may have waveforms due to the input signal IN and the inverted input signal INb input to the first transmission circuit 1TRAN in FIG. 3. However, since a signal input to the replica circuit REP does not exist, the replica main current amount mIp_R may be maintained at a constant value. Therefore, the main current amount in the oscillator 1000 of FIG. 1 may become a total main current amount mIp_T calculated by adding the replica main current amount mIp_R and the first and second main current amounts 1mIp and 2mIp of each of the first to k-th transmission circuits 1TRAN to kTRAN of FIG. 2.

Referring to FIGS. 3, 6 and 9, the first and second sub current amounts 1sIp and 2sIp may have waveforms due to the input signal IN and the inverted input signal INb input to the first transmission circuit 1TRAN of FIG. 3. However, since a signal input to the replica circuit REP does not exist, the replica sub current amount sIp_R may be maintained at a constant value. Therefore, the sub current amount in the oscillator 1000 of FIG. 1 may become a total sub current amount sIp_T calculated by adding the replica sub current amount sIp_R and the first and second sub current amounts 1sIp and 2sIp of each of the first to k-th transmission circuits 1 to kTRAN of FIG. 2.

Figure 10:
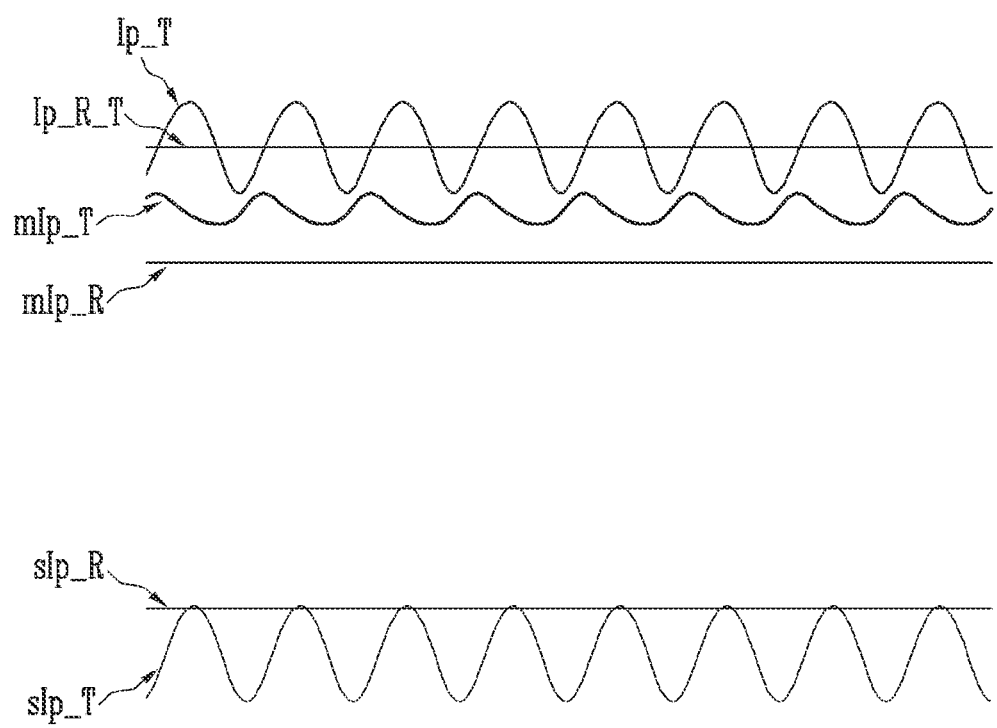
FIG. 10 is a diagram illustrating a total current amount of a replica circuit and a total current amount of an oscillator according to an embodiment of the present disclosure.

FIG. 10 is a diagram illustrating a total current amount of a replica circuit and a total current amount of an oscillator according to an embodiment of the present disclosure.

Referring to FIG. 10 and Table 3, according to the size of the switches, a total sub current amount sIp_T of the transmission circuits is the least, and the replica sub current amount sIp_R of the replica circuit REP is greater than the total sub current amount sip_T. Since the switches included in the replica main circuit MAC_R and the main circuit MAC are implemented in the size larger than that of the switches included in the replica sub circuit SBC_R and the sub circuit SBC, the replica main current amount mIp_R and the total main current amount mIp_T is larger than the replica sub current amount sip_R and the total sub current amount sip_T. Since the switches included in the main circuit MAC are implemented in the size larger than that of the switches included in the replica main circuit MAC_R, the total main current amount mIp_T is greater than the replica main current amount mIp_R. Therefore, a total replica current amount Ip_R_T as a whole of the oscillator 1000 of FIG. 1 may be maintained constant, and the total current amount Ip_T may form a waveform in response to the input signal IN.

Figure 11:
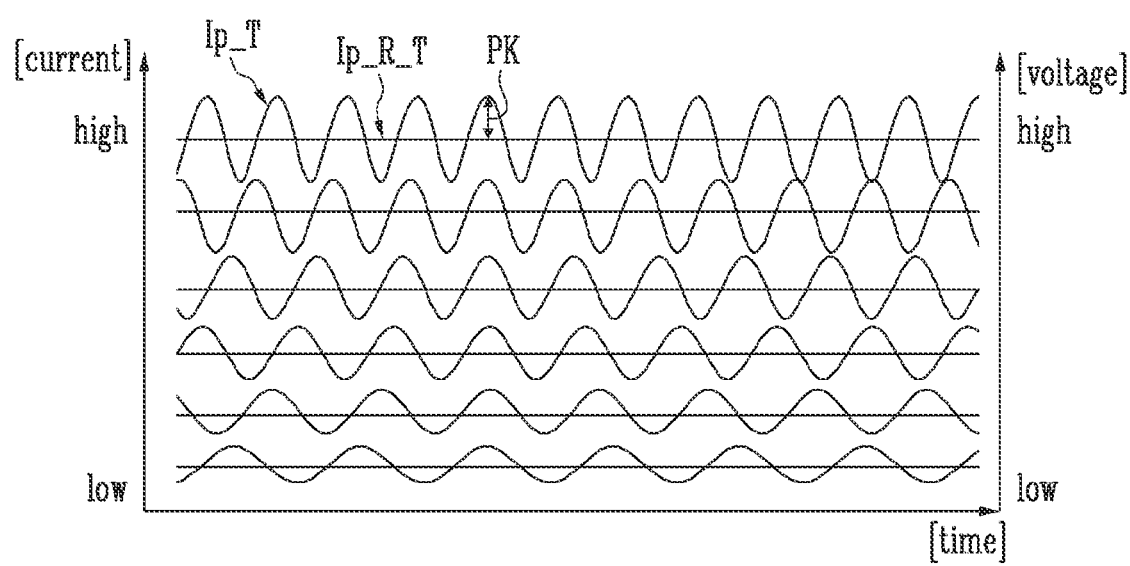
FIG. 11 is a diagram illustrating a current amount of the oscillator based on a replica voltage and a control voltage according to an embodiment of the present disclosure.

FIG. 11 is a diagram illustrating a current amount of the oscillator based on the replica voltage and the control voltage according to an embodiment of the present disclosure.

Referring to FIG. 11, when the control voltage Vvco and the replica voltage Vrep generated inside the oscillator 1000 in FIG. 1 are low, the current amount flowing inside the oscillator 1000 decreases, and thus the total replica current amount Ip_R_T and the total current amount Ip_T may decrease. As the total current amount Ip_T decreases, an amplitude PK also decreases, and thus removal of noise may be difficult. Conversely, when the control voltage Vvco and the replica voltage Vrep are high, the current amount flowing inside the oscillator 1000 increases, and thus the total replica current amount Ip_R_T and the total current amount Ip_T may increase. As the total current amount Ip_T increases, the amplitude PK of the current amount also increases, and thus a difference between a maximum peak and a minimum peak of the waveform increases. Thus, removal of noise may become easy.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal.

What is claimed is:

1. A replica circuit comprising:
   a first terminal to which a replica voltage having a positive voltage is supplied;
   a second terminal to which a ground voltage is supplied;
   a replica main circuit connected between the first terminal and the second terminal and configured to form a first current path in response to the replica voltage, in order to replicate a current of a main circuit that generates a sub clock and an inverted sub clock in a voltage controlled oscillator; and
   a replica sub circuit connected in parallel with the replica main circuit between the first terminal and the second terminal and configured to form a second current path in response to the replica voltage, in order to replicate a current of a sub circuit for reducing noise of the sub clock and the inverted sub clock in the voltage controlled oscillator,
   wherein the replica main circuit is configured so that a current flowing through the first current path has a replica main current amount, and
   wherein the replica sub circuit is configured so that a current flowing through the second current path has a replica sub current amount less than the replica main current amount.

2. The replica circuit of claim 1, wherein the replica main circuit comprises a first switch and a second switch connected in series between the first terminal and the second terminal.

3. The replica circuit of claim 2,
   wherein the first switch includes a PMOS transistor connected between the first terminal and the second switch, and
   wherein a gate of the first switch is connected to a terminal to which the ground voltage is supplied.

4. The replica circuit of claim 2,
wherein the second switch includes an NMOS transistor connected between the first switch and the second terminal, and
wherein a gate of the second switch is connected to the first terminal.

5. The replica circuit of claim 1,
wherein the replica sub circuit comprises:
a third switch and a fourth switch connected in series between the first terminal and the second terminal; and
a first resistor and a second resistor connected in parallel with the third and fourth switches between the first terminal and the second terminal.

6. The replica circuit of claim 5,
wherein the third switch includes a PMOS transistor connected between the first terminal and the fourth switch, and
wherein a gate of the third switch is connected to a node between the first resistor and the second resistor.

7. The replica circuit of claim 5,
wherein the fourth switch includes an NMOS transistor connected between the third switch and the second terminal, and
wherein a gate of the fourth switch is connected to a node between the third switch and the fourth switch.

8. The replica circuit of claim 5, wherein the first resistor and the second resistor are connected in series between the first terminal and the second terminal.

9. The replica circuit of claim 5, wherein the first resistor is configured to have a resistance value greater than that of the second resistor.

10. The replica circuit of claim 1, wherein each of the replica main and sub circuits includes switches, and switches configuring the replica sub circuit have a size less than that of switches configuring the replica main circuit.

11. An oscillator comprising:
a voltage controlled oscillator operable according to a control voltage and including:
a main circuit configured to generate a clock and an inverted clock by inverting an input signal and an inverted input signal, respectively; and
a sub circuit configured to reduce noise of the clock and the inverted clock;
a replica circuit operable according to a replica voltage and including:
a replica main circuit configured to replicate a voltage or a current of the main circuit; and
a replica sub circuit configured to replicate a voltage or a current of the sub circuit; and
an amplifier configured to output an amplified voltage to the voltage controlled oscillator and the replica circuit by amplifying a difference between a reference voltage and the replica voltage so that the replica voltage and the control voltage are equal to each other,
wherein the voltage controlled oscillator is configured to adjust the control voltage in response to the amplified voltage, and the replica circuit is configured to maintain a level of the replica voltage in response to the amplified voltage, and
wherein the level of the replica voltage is adjusted according to a size of switches configuring the replica main circuit and the replica sub circuit.

12. The oscillator of claim 11, wherein the main circuit comprises:
a first inverter operable according to the control voltage and configured to output the clock by inverting the input signal; and
a second inverter operable according to the control voltage and configured to output the inverted clock by inverting the inverted input signal.

13. The oscillator of claim 12, wherein the sub circuit comprises:
a third inverter operable according to the control voltage and configured to output the inverted clock to an output node of the second inverter by inverting the clock; and
a fourth inverter operable according to the control voltage and configured to output the clock to an output node of the first inverter by inverting the inverted clock.

14. The oscillator of claim 13, wherein a sub current amount flowing inside the sub circuit is less than a main current amount flowing inside the main circuit.

15. The oscillator of claim 13, wherein each of the third inverter and the fourth inverter has a size less than that of each of the first inverter and the second inverter.

16. The oscillator of claim 11,
wherein the replica main circuit includes a first switch and a second switch connected in series between a first terminal to which the replica voltage is supplied and a second terminal to which a ground voltage is supplied, and
wherein the replica sub circuit includes:
a third switch and a fourth switch connected in series between the first terminal and the second terminal; and
a first resistor and a second resistor connected in series between the first terminal and the second terminal.

17. The oscillator of claim 16,
wherein the first switch includes a PMOS transistor connected between the first terminal and the second switch,
wherein the second switch includes an NMOS transistor connected between the first switch and the second terminal,
wherein the third switch includes a PMOS transistor connected between the first terminal and the fourth switch, and
wherein the fourth switch includes an NMOS transistor connected between the third switch and the second terminal.

18. The oscillator of claim 17,
wherein a gate of the first switch is connected to a terminal to which the ground voltage is supplied,
wherein a gate of the second switch is connected to the first terminal,
wherein a gate of the third switch is connected to a node between the first resistor and the second resistor, and
wherein a gate of the fourth switch is connected to a node between the third switch and the fourth switch.

19. The oscillator of claim 16, wherein each of the third switch and the fourth switch has a size less than that of each of the first switch and the second switch.

20. The oscillator of claim 16, wherein the first resistor has a resistance value greater than that of the second resistor.

* * * * *